Figure 1:
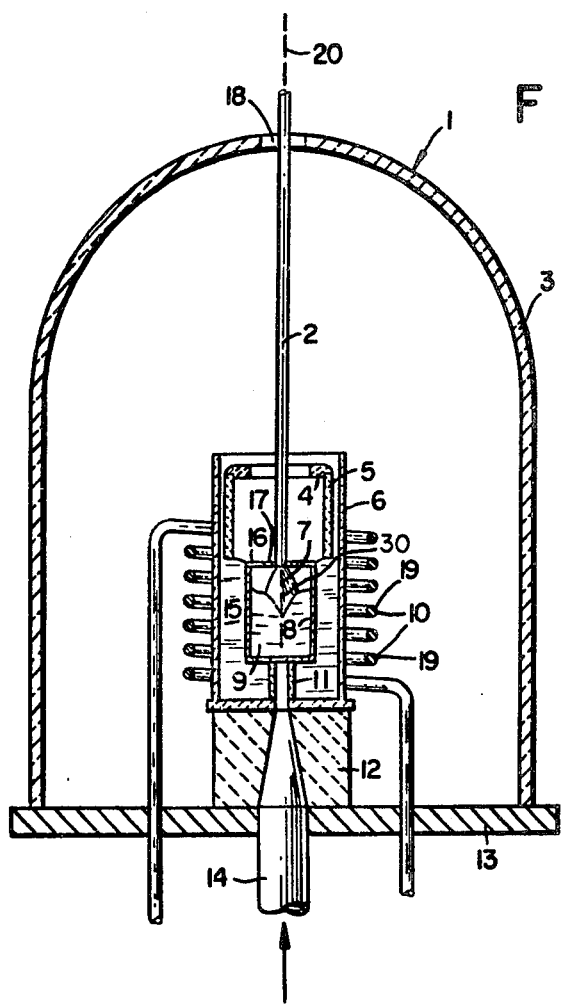

United States Patent [19]

Brandle, Jr. et al.

[11] 4,199,396

[45] Apr. 22, 1980

[54] METHOD FOR PRODUCING SINGLE CRYSTAL GADOLINIUM GALLIUM GARNET

[75] Inventors: Charles D. Brandle, Jr.; John B. Hassell, Jr., both of San Diego, Calif.

[73] Assignee: Union Carbide Corporation, New York, N.Y.

[21] Appl. No.: 900,268

[22] Filed: Apr. 26, 1978

Related U.S. Application Data

[63] Continuation of Ser. No. 699,460, Jun. 24, 1976, abandoned.

[51] Int. Cl.² .................. B01J 17/18; C01F 17/00
[52] U.S. Cl. .................. 156/617 SP; 156/DIG. 63; 422/249; 423/21.1; 423/263; 423/593
[58] Field of Search .............. 156/600, 617 SP, 605, 156/DIG. 63; 422/249; 423/21, 263, 593; 252/62, 57

[56] References Cited

U.S. PATENT DOCUMENTS

| | | | |
|---|---|---|---|
| 2,957,827 | 10/1960 | Nielsen | 156/DIG. 63 |
| 3,079,240 | 2/1963 | Remeika | 156/DIG. 63 |
| 3,117,934 | 1/1964 | Linares | 156/DIG. 74 |
| 3,291,740 | 12/1966 | Espinosa | 156/DIG. 63 |
| 3,723,599 | 3/1973 | Brandle et al. | 156/DIG. 63 |
| 3,951,729 | 4/1976 | Takagi | 156/DIG. 63 |
| 3,959,006 | 5/1976 | Herrning | 156/DIG. 63 |

FOREIGN PATENT DOCUMENTS

| | | | |
|---|---|---|---|
| 50-44497 | 5/1975 | Japan | 156/DIG. 63 |
| 51-43399 | 4/1976 | Japan | 156/DIG. 63 |
| 51-43400 | 4/1976 | Japan | 156/DIG. 63 |

OTHER PUBLICATIONS

O'Kane, J. Electrochem. Soc., vol. 20, #9, Sep. 1973, pp. 1272–1275.
Grodkiewicz, Crystal Growth Supp. of J. of Phys. and Chem. of Solids, pp. 441–444, (1967).
Landise, *The Growth of Single Crystals*, Prentice-Hall, Inc., Bell Tele. Lab., 1970, pp. 196–197.
Ciszek, IBM Tech. Discl. Bull., vol. 17, #2, Jul. 1974, pp. 426–427.
Lindres, Solid State Communications, "Growth of Garnet Laser Crystals", vol. 2, pp. 229–231, 1964.
Dudorow, Instru. and Exper. Tech., (USSR), vol. 17, #2, pt. 2, pp. 589–591, Mar.–Apr. 1974 (Pub. Sep. 1974).
Sirvetz, J. of App. Phys., vol. 29, #1, p. 431, Mar. 1958.
Brandle et al., J. of Crystal Growth, vol. 12, #1 (1972) pp. 3–8.

*Primary Examiner*—Stephen J. Emery
*Attorney, Agent, or Firm*—Frederick J. McCarthy, Jr.

[57] ABSTRACT

Method for producing virtually perfect massive unicrystalline gadolinium gallium garnet from a melt of gadolinium and gallium oxides containing an addition of calcium, magnesium or strontium ions.

6 Claims, 2 Drawing Figures

U.S. Patent        Apr. 22, 1980        4,199,396

METHOD FOR PRODUCING SINGLE CRYSTAL GADOLINIUM GALLIUM GARNET

This application is a continuation of our prior U.S. application Ser. No. 699,460 filed June 24, 1976, now abandoned.

The present invention relates to a method for producing virtually perfect massive unicrystalline gadolinium gallium garnet material. More particularly, the present invention is directed to a method for producing such material from an oxide melt containing a predetermined amount of calcium, magnesium or strontium ion.

Unicrystalline gadolinium gallium garnet material in massive form is produced following the well known Czochralski technique by pulling a seed rod from a melt of $Gd_2O_3$ and $Ga_2O_3$ in a molar ratio of 3:5. The resulting material is used in the form of wafers as substrates in electronic applications such as for the epitaxial growth of iron garnet film. It is very important that these substrates, and hence the crystal from which they are formed, be free of imperfections, e.g. linear edge dislocations. This is so since such dislocations will propagate into epitaxial layers formed on crystalline substrates with well known detrimental effect.

It has been found that the above noted imperfections occur with significant frequency unless the crystal growing operation is very carefully monitored to detect signs of abnormal growth and the operational thermal conditions appropriately adjusted by techniques known to the art. Alternatively, it has been discovered that virtually perfect unicrystalline material can be produced without substantial abnormal growth by predetermined additions to the melt from which the crystal is grown.

It is, therefore, an object of the present invention to provide a method for producing massive unicrystalline virtually perfect gadolinium gallium garnet.

Figure 2:
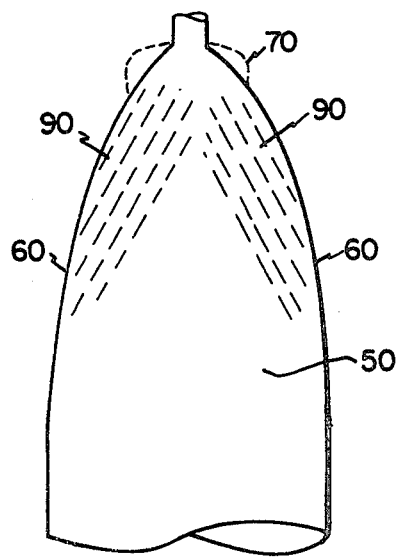

Other objects will be apparent from the following description and claims taken in conjunction with the drawing in which:

FIG. 1 shows an apparatus suitable for the practice of the present invention and FIG. 2 illustrates a portion of a unicrystalline shape produced by the practice of the present invention.

The method of the present invention for producing virtually perfect unicrystalline gadolinium gallium garnet involves the following steps:

(i) forming a melt by heating a mixture of $Gd_2O_3$ and $Ga_2O_3$ in a molar ratio of 3:5 and adding a predetermined amount of at least one metal ion selected from the group consisting of calcium, magnesium and strontium to provide from about 15 to 100 ppm in the aggregate of selected metal ion in the melt, the melt being at a temperature in the range of 1700° to 1800° C.

(ii) inserting a seed rod of unicrystalline gadolinium gallium garnet into the melt.

(iii) maintaining an atmosphere over the melt which is substantially chemically inert to the melt, and (iv) withdrawing the seed rod from the melt such that gadolinium gallium garnet material is solidified and crystallized on the seed rod to form a virtually perfect massive unicrystalline product of increasing length and substantially circular cross-section having a growth axis common with the longitudinal axis of the seed rod.

The improvement of the present invention with respect to previous Czochralski growth techniques resides in the addition to the oxide melt of at least one of the metal ions of calcium, magnesium or strontium to provide in the melt an appropriate amount of ion in the range of about 15 ppm to 100 ppm whereby a virtually perfect unicrystalline material free of imperfections, e.g. edge dislocations is obtained. It has been found that relatively fast crystal growth rates can be achieved in the practice of the present invention without detrimentally affecting the quality of the unicrystalline material which can range up to three inch diameters and ten inches and more in lengths.

In the practice of the present invention, the amount of selected metal ion provided in the melt can be from about 15 parts per million (ppm) to about 100 ppm by weight, with the preferred amount being from about 15 to 25 ppm. With lesser amounts of selected metal ion, edge dislocations regularly occur in the product crystal unless special precautions are taken while at greater amounts undesirable discoloration of the product crystal can occur.

The metal ion additions to the product crystal are accomplished by melting additions of selected metal oxides, carbonates or other ionizable compounds to obtain the desired metal ion content in the melt from which the product crystal is formed.

With reference to FIG. 1, there is illustrated a crystal growth chamber 1. A melt 9 of $Gd_2O_3$ and $GA_2O_3$ in a molar ratio of 3:5 having an addition of one or more metal ions as described above is contained in a crucible 8 which is preferably fabricated from iridium. A washer 16, preferably iridium, having a central aperture 17 rests on top the crucible 8 and acts as a radiation shield to reduce heat loss from the melt 9. The crucible 8 is bounded on its sides and bottom with insulation 15. The insulation is preferably zirconia and serves to: reduce the power required to sustain the melt 9; reduce thermal gradients along the crucible; and to dampen temperature fluctuations arising from line voltage fluctuations, convective cooling effects from the atmosphere, as well as other disturbances. Hollow tubing 11 forms an aperture through which the temperature of the bottom of the crucible 8 can be determined by, for example, a radiation pyrometer focused on the center of the bottom of the crucible.

A ceramic washer 4, fabricated from alumina, for example, is supported by tubing 5 preferably of zirconia. The washer 4 serves as a secondary radiation shield and to restrict the convective currents of the atmosphere against entering the top of the crucible and reaching the growing crystal 7. Thus, it serves to reduce the vertical temperature gradients in the vicinity of the growing crystal and to augment the effects of the washer 16.

Sleeve 6, formed of silicon dioxide, for example, serves to contain the insulation 15 and serves as a part of the insulating assembly surrounding the crucible 8. The tubing 5 which serves to support the washer 4 also functions as a part of the insulating system.

The crucible 8 and its surrounding insulating assembly rests on a ceramic pedestal 12 composed of, for example, zirconium oxide ($ZrO_2$). The entire assembly is enclosed in a bell jar 3 sealed to a base plate 13. The base plate 13 is composed of any suitable material such as for example silicone-bonded fiber glass. The desired gas atmosphere for the inside of the crucible 8, i.e. a gas atmosphere non-reactive with the melt in the crucible, e.g. nitrogen with 2% by volume oxygen, is introduced into sight tube 14 which communicated with tubing 11. The gas exits through the hole 18 in the bell jar 3 through which the seed rod 2 is inserted. Seed rod 2 has an end portion in the form of unicrystalline gadolinium gallium garnet material having its longitudinal axis 20 common with the growth axis 30 of crystal 7 and the orientation of the unicrystalline material of seed rod 2 is a predetermined orientation depending on the ultimate industrial use. Such a seed rod can be routinely prepared and results in the production of a massive unicrystalline material.

Using the above described apparatus, an addition of a selected metal ion from the group of calcium, magnesium and strontium is added to the $Gd_2O_3$-$Ga_2O_3$ melt, for example, by including a compound of the selected ion addition with the initial charge prior to melting or by addition to the charge after it has become molten. The temperature of the melt is maintained in the range of 1700° to 1800° C. and a unicrystalline mass is pulled from the melt following procedures known to the art as exemplified by U.S. Pat. No. 3,715,194. The resulting unicrystalline material has a substantially circular uniform cross-section and is virtually perfect and free of imperfections. FIG. 2 illustrates a portion of a shape of unicrystalline material 50 grown in accordance with the present invention characterized by substantially parabolic initial growth surface 60. When less than about 15 ppm of selected metal ion are present, the initial growth surfaces tend to follow the dotted line 70 and unless rapidly corrected by adjustment of melt furnace operation, results in crystal having imperfections.

The following examples will further illustrate the present invention.

EXAMPLE I

About 6000 grams of $Gd_2O_3$ and $Ga_2O_3$ in a molar ratio of 3:5 were placed in an iridium crucible having an inside diameter of 4.25 inches, a wall thickness of 0.060 inch and a height of five inches. The $Gd_2O_3$-$Ga_2O_3$ material contained less than 10 ppm of calcium, magnesium and strontium. The crucible was placed within a 10 turn induction heating coil having an I.D. of 7.53 inches. The crucible stood on a pedestal containing packed zirconia granules while the space between the coil and the crucible was also packed with zirconia granules. This entire apparatus was enclosed in an aluminum bell jar having an aperture at its top. A nitrogen atmosphere containing about 2% by volume oxygen was maintained inside the bell jar. The induction hearing coil was energized from a well known R.F. induction heating unit and the power was increased until the induced current in the iridium crucible heated it to a "white heat". Conductive heat from the iridium crucible then melted the $Gd_2O_3$ and $Ga_2O_3$ to form a melt. A unicrystalline gadolinium gallium garnet seed 0.25 inch diameter (<111> orientation) was lowered through the aperture in the bell jar until it contacted the surface of the melt. The seed was then withdrawn from the melt at about 0.125 inch per hour for 9 hours. A highly distorted boule of irregualr cross-section was obtained which contained numerous gross edge dislocations.

EXAMPLE II

About 6000 grams of $Gd_2O_3$ and $Ga_2O_3$ in a molar ratio of 3:5 without any addition were placed in an iridium crucible having an inside diameter of 4.25 inches, a wall thickness of 0.060 inch and a height of 5 inches. The $Gd_2O_3$-$Ga_2O_3$ material contained less than 10 ppm of calcium, magnesium, and strontium. The crucible was placed within a 10 turn induction heating coil having an I.D. of 7.5 inches. The crucible stood on a pedestal containing packed zirconia granules while the space between the coil and the crucible was also packed with zirconia granules. This entire apparatus was enclosed in a glass bell jar having an aperture at its top. A nitrogen atmosphere containing about 2% by volume oxygen was maintained inside the bell jar. The induction heating coil was energized from a well known R.F. induction heating unit and the power was increased until the induced current in the iridium crucible heated it to a "white heat". Conductive heat from the iridium crucible then melted the $Gd_2O_3$-$Ga_2O_3$ material to form a melt. 1.5 grams of $CaCO_3$ were added to the $Gd_2O_3$-$Ga_2O_3$ melt in the crucible to provide a calcium ion content of 100 ppm in the melt. A unicrystalline gadolinium gallium garnet seed 0.25 inch diameter (<111>) was lowered through the aperture in the bell jar until it contacted the surface of the melt. The seed was then withdrawn from the melt at about 0.125 inch per hour for 27 hours. The final elongated boule was of uniform circular cross-section having a final diameter measurement of 3.2 inches and a final length of 6.25 inches. This boule was massive virtually perfect unicrystalline gadolinium gallium garnet free of edge dislocations.

EXAMPLE III

About 6000 grams of $Gd_2O_3$ and $Ga_2O_3$ in a molar ratio of 3:5 without any addition were placed in an iridium crucible having an inside diameter of 4.25 inches, a wall thickness of 0.060 inch and a height of 5 inches. The $Gd_2O_3$-$Ga_2O_3$ material contained less than 10 ppm of calcium, magnesium, and strontium. The crucible was placed within a 10 turn induction heating coil having an I.D. of 7.5 inches. The crucible stood on a pedestal containing packed zirconia granules while the space between the coil and the crucible was also packed with zirconia granules. This entire apparatus was enclosed in a glass bell jar having an aperture at its top. A nitrogen atmosphere containing about 2% by volume oxygen was maintained inside the bell jar. The induction heating coil was energized from a well known R.F. induction heating unit and the power was increased until the induced current in the iridium crucible heated it to a "white heat". Conductive heat from the iridium crucible then melted the $Gd_2O_3$-$Ga_2O_3$ material to form a melt. 0.5 grams of $CaCO_3$ were added to the $Gd_2O_3$-$Ga_2O_3$ melt in the crucible to provide a calcium ion content of 33 ppm in the melt. A unicrystalline gadolinium gallium garnet seed 0.25 inch diameter (<111>) was lowered through the aperture in the bell jar until it contacted the surface of the melt. The seed was then withdrawn from the melt at about 0.125 inch per hour for 30 hours. The final elongated boule was of uniform circular cross-section having a final diameter measurement of 3.2 inches and a final length of 6.25 inches. This boule was massive virtually perfect unicrystalline gadolinium gallium garnet free of edge dislocations.

EXAMPLE IV

About 5500 grams of $Gd_2O_3$ and $Ga_2O_3$ in a molar ratio of 3:5 without any addition were placed in an iridium crucible having an inside diameter of 4.00 inches, a wall thickness of 0.10 inch and a height of 4.5 inches. the $Gd_2O_3$-$Ga_2O_3$ material contained less than 10 ppm of calcium, magnesium, and strontium. The crucible was placed within a 10 turn induction heating coil having an I.D. of 7.5 inches. The crucible stood on a pedestal containing packed zirconia granules while the space between the coil and the crucible was also packed with zirconia granules. This entire apparatus was enclosed in a glass bell jar having an aperture at its top. A nitrogen atmosphere containing about 2% by volume oxygen was maintained inside the bell jar. The induction heating coil was energized from a well known R.F. induction heating unit and the power was increased until the induced current in the iridium crucible heated it to a "white heat". Conductive heat from the iridium crucible then melted the $Gd_2O_3$-$Ga_2O_3$ material to form a melt. 0.66 grams of $CaCO_3$ were added to the $Gd_2O_3$-$GA_2O_3$ melt in the crucible to provide a calcium ion content of 50 ppm in the melt. A unicrystalline gadolinium gallium garnet seed 0.25 inch diameter ($<111>$) was lowered through the aperture in the bell jar until it contacted the surface of the melt. The seed was then withdrawn from the melt at about 0.18 inch per hour for 42 hours. The final elongated boule was of uniform circular cross-section having a final diameter measurement of 2.25 inches and a final length of 10.00 inches. This boule was massive virtually perfect unicrystalline gadolinium gallium garnet free of edge dislocations.

EXAMPLE V

About 5500 grams of $Gd_2O_3$ and $Ga_2O_3$ in a molar ratio of 3:5 without any addition were placed in an iridium crucible having an inside diameter of 4.00 inches, a wall thickness of 0.100 inch and a height of 4.5 inches. The $Gd_2O_3$-$Ga_2O_3$ material contained less than 10 ppm of calcium, magnesium, and strontium. The crucible was placed within a 10 turn induction heating coil having an I.D. of 7.5 inches. The crucible stood on a pedestal containing packed zirconia granules while the space between the coil and the crucible was also packed with zirconia granules. This entire apparatus was enclosed in a glass bell jar having an aperture at its top. A nitrogen atmosphere containing about 2% by volume oxygen was maintained inside the bell jar. The induction heating coil was energized from a well known R.F. induction heating unit and the power was increased until the induced current in the iridium crucible heated it to a "white heat". Conductive heat from the iridium crucible then melted the $Gd_2O_3$-$Ga_2O_3$ material to form a melt. 0.34 grams of $CaCO_3$ were added to the $Gd_2O_3$-$Ga_2O_3$ melt in the crucible to provide a calcium ion content of 25 ppm in the melt. A unicrystalline gadolinium gallium garnet seed 0.25 inch diameter ($<111>$) was lowered through the aperture in the bell jar until it contacted the surface of the melt. The seed was then withdrawn from the melt at about 0.18 inch per hour for 34 hours. The final elongated boule was of uniform circular cross-section having a final diameter measurement of 2.2 inches and a final length of 8.00 inches. This boule was massive virtually perfect unicrystalline gadolinium gallium garnet free of edge dislocations.

As can be seen from the foregoing examples, the gadolinium gallium garnet boules of Examples II, III, IV and V produced from calcium ion containing melts in accordance with the present invention were free of edge dislocations, whereas the gadolinium gallium garnet product of Example I which contained less than 10 ppm in the aggregate of calcium, magnesium and strontium was grossly distorted and contained numerous edge dislocations even though made by essentially the same procedure as Examples II to V.

What is claimed is:

1. Method for producing a virtually perfect unicrystalline gadolinium gallium garnet boule having a diameter of about 2.2 to 3.2 inches which comprises:
   (i) forming a melt by heating a mixture of $Gd_2O_3$ and $Ga_2O_3$ in molar ratio of 3:5 initially containing less than about 10 ppm in the aggregate of calcium, magnesium and strontium, and adding a predetermined amount of at least one metal ion selected from the group consisting of calcium, magnesium and strontium to provide from about 15 to 100 ppm in the aggregate of selected metal ion in the melt, the melt being at a temperature in the range of 1700° to 1800° C.
   (ii) inserting a seed rod of unicrystalline gadolinium gallium garnet into the melt,
   (iii) maintaining an atmosphere over the melt which is substantially chemically inert to the melt, and
   (iv) withdrawing the seed rod from the melt such that gadolinium gallium garnet material is solidified and crystallized on the seed rod to form a virtually perfect massive unicrystalline product of increasing length and substantially circular cross-section having a growth axis common with the longitudinal axis of the seed rod.

2. Method in accordance with claim 1 wherein about from 15 to 25 ppm in the aggregate of selected metal ion is provided in the melt.

3. Method in accordance with claim 1 wherein from about 25 to 100 ppm in the aggregate of selected metal ion is provided in the melt.

4. Method in accordance with claim 1 wherein the selected metal ion is calcium and about 25 ppm of calcium ion is provided in the melt.

5. Method in accordance with claim 1 wherein the selected metal ion is calcium.

6. Method in accordance with claim 1 wherein the selected metal ion is calcium and about 50 ppm of calcium ion is provided in the melt.

* * * * *